United States Patent
Davidson et al.

(10) Patent No.: US 11,140,979 B2
(45) Date of Patent: Oct. 12, 2021

(54) VARIABLE HEIGHT SUPPORT ASSEMBLY FOR AN ELECTRONIC DEVICE WITH A MONITOR

(71) Applicant: SE-KURE CONTROLS, INC., Franklin Park, IL (US)

(72) Inventors: R. Scott Davidson, Sturgis, MI (US); Clifford Weidler, Sturgis, MI (US); Roger J. Leyden, Inverness, IL (US)

(73) Assignee: Se-Kure Controls, Inc., Franklin Park, IL (US)

( * ) Notice: Subject to any disclaimer, the term of this patent is extended or adjusted under 35 U.S.C. 154(b) by 0 days.

(21) Appl. No.: 16/528,865

(22) Filed: Aug. 1, 2019

(65) Prior Publication Data

US 2021/0037663 A1 Feb. 4, 2021

(51) Int. Cl.
| | | |
|---|---|---|
| *A47B 47/04* | (2006.01) | |
| *F16M 11/00* | (2006.01) | |
| *A47B 47/00* | (2006.01) | |
| *A47B 3/06* | (2006.01) | |
| *F16M 11/22* | (2006.01) | |

(Continued)

(52) U.S. Cl.
CPC .............. *A47B 47/042* (2013.01); *A47B 3/06* (2013.01); *A47B 47/0075* (2013.01); *F16M 11/00* (2013.01); *A47B 13/003* (2013.01); *A47B 2230/0085* (2013.01); *A47B 2230/0092* (2013.01); *A47C 4/021* (2013.01); *F16M 11/22* (2013.01); *F16M 11/24* (2013.01);
(Continued)

(58) Field of Classification Search
CPC .......... A47B 2230/0085; A47B 47/042; A47B 2230/0092; A47B 13/003; A47B 2220/0086; A47B 3/06; A47B 47/0075; A47B 47/0091; F16M 11/22; F16M 11/00; F16M 2200/08; A47C 4/021; B65D 2519/00567; B65D 2519/00273; B65D 2519/00373

See application file for complete search history.

(56) References Cited

U.S. PATENT DOCUMENTS

| | | | | |
|---|---|---|---|---|
| 1,934,846 A | * | 11/1933 | Ebert | A47F 5/112 |
| | | | | 108/101 |
| 1,940,117 A | * | 12/1933 | Carpos | A47B 3/06 |
| | | | | 108/157.18 |

(Continued)

FOREIGN PATENT DOCUMENTS

| | | | | | |
|---|---|---|---|---|---|
| EP | 0593407 A1 | * | 4/1994 | ........... | A47B 47/042 |
| JP | 2006034862 A | * | 3/2006 | ........... | A47B 57/585 |
| WO | WO-0232256 A2 | * | 4/2002 | ........... | A47B 13/003 |

*Primary Examiner* — Jonathan Liu
*Assistant Examiner* — Taylor L Morris
(74) *Attorney, Agent, or Firm* — Wood, Phillips, Katz, Clark & Mortimer

(57) ABSTRACT

The combination of: an electronic device having a monitor; and a support assembly made up of a collection of components. A first plurality of the components can be selectively changed between: a) a first state wherein at least two of the components in the first plurality of components are separated from each other and a third component; and b) a second state wherein the first plurality of components cooperatively define a first support assembly configuration with a device support surface to elevate the supported device. The first plurality of components is changeable between the first and second states without requiring use of any fasteners.

16 Claims, 3 Drawing Sheets

(51) Int. Cl.
*A47C 4/02* (2006.01)
*A47B 13/00* (2006.01)
*H05K 5/02* (2006.01)
*H05K 5/00* (2006.01)
*F16M 11/24* (2006.01)

(52) U.S. Cl.
CPC ....... *F16M 2200/08* (2013.01); *H05K 5/0017* (2013.01); *H05K 5/0217* (2013.01)

(56) References Cited

U.S. PATENT DOCUMENTS

| | | | | |
|---|---|---|---|---|
| 2,000,915 A * | 5/1935 | Blake | A47B 3/06 | 108/159 |
| 2,435,132 A * | 1/1948 | D Horaene | A47F 5/10 | 108/101 |
| 3,069,216 A * | 12/1962 | Vaeth | A47B 47/042 | 312/195 |
| 3,217,965 A * | 11/1965 | Macie | B65D 19/20 | 206/600 |
| 3,338,189 A * | 8/1967 | Xavier | A47C 4/021 | 108/183 |
| 3,566,808 A * | 3/1971 | Slate, Jr. | A47B 3/12 | 108/157.14 |
| 3,593,955 A * | 7/1971 | Hind | A47B 23/042 | 248/448 |
| 3,620,175 A * | 11/1971 | Crane | A47B 3/12 | 108/157.14 |
| 3,651,769 A * | 3/1972 | Foley | B65D 19/0075 | 108/56.1 |
| 3,683,823 A * | 8/1972 | Schmid | B65D 19/0012 | 108/156 |
| 4,055,924 A * | 11/1977 | Beaver, Jr. | A47B 47/042 | 52/262 |
| 4,084,517 A * | 4/1978 | Guess | A47B 3/06 | 108/158.12 |
| 4,102,525 A * | 7/1978 | Albano | A47B 47/06 | 108/51.3 |
| 4,153,311 A * | 5/1979 | Takahashi | A47B 47/042 | 312/107 |
| 4,267,998 A * | 5/1981 | Weirich | A47B 3/06 | 249/165 |
| 4,379,432 A * | 4/1983 | Grossman | A47F 5/04 | 108/159 |
| 4,562,776 A * | 1/1986 | Miranda | A47B 47/042 | 108/158.12 |
| 4,638,745 A * | 1/1987 | Sheffer | A47F 5/112 | 108/156 |
| 4,740,032 A * | 4/1988 | Olsen | A47B 3/14 | 297/139 |
| 4,883,331 A * | 11/1989 | Mengel | A47B 13/003 | 312/195 |
| 5,031,683 A * | 7/1991 | Marvy | E01F 9/688 | 160/351 |
| 5,184,558 A * | 2/1993 | Wozniacki | B65D 19/0028 | 108/51.3 |
| 5,224,429 A | 7/1993 | Borgman et al. | | |
| 5,253,933 A * | 10/1993 | Walker | H04R 1/026 | 181/199 |
| 5,261,556 A * | 11/1993 | Gatto | B25H 3/023 | 206/373 |
| 5,303,829 A * | 4/1994 | Kennedy | A47F 7/06 | 211/30 |
| 5,335,753 A * | 8/1994 | Campbell | B25H 1/06 | 182/151 |
| 5,452,667 A * | 9/1995 | Lim | B65D 19/0012 | 108/51.3 |
| 5,644,995 A * | 7/1997 | Gurwell | A47B 3/12 | 108/158.12 |
| 5,701,827 A * | 12/1997 | Urabe | B65D 19/0012 | 108/180 |
| 5,901,652 A * | 5/1999 | Kaiser | A47B 47/04 | 108/158.13 |
| 6,007,167 A * | 12/1999 | Cohen | G11B 33/0483 | 206/387.15 |
| 6,174,116 B1 * | 1/2001 | Brand | B60P 7/14 | 410/121 |
| 6,206,473 B1 * | 3/2001 | Kondratiev | A47B 13/003 | 297/440.1 |
| 6,267,065 B1 * | 7/2001 | Lin | A47B 13/003 | 108/157.14 |
| 6,595,143 B2 * | 7/2003 | London | A47D 3/00 | 108/25 |
| 7,140,307 B1 * | 11/2006 | Wolbert | A47B 47/0075 | 108/153.1 |
| 7,159,053 B1 | 1/2007 | Lakin | | |
| 7,503,532 B2 | 3/2009 | Sim et al. | | |
| 7,516,708 B2 * | 4/2009 | Willy | A47B 3/06 | 108/157.14 |
| 7,631,605 B2 * | 12/2009 | Willy | A47B 13/003 | 108/157.16 |
| 7,677,518 B2 | 3/2010 | Chouinard et al. | | |
| 7,779,765 B2 * | 8/2010 | Donnell, Jr. | B65D 19/0016 | 108/57.26 |
| 7,856,772 B1 * | 12/2010 | Culp | A47B 47/047 | 52/211 |
| 8,316,780 B2 * | 11/2012 | Ng | B65D 19/18 | 108/56.1 |
| 8,832,917 B1 * | 9/2014 | Elliott | B23P 17/00 | 29/428 |
| 8,967,057 B2 | 3/2015 | Quiring et al. | | |
| 9,090,379 B2 * | 7/2015 | Nelson | B65D 19/44 | |
| 9,103,488 B2 | 8/2015 | Stengel | | |
| 9,113,703 B2 | 8/2015 | Flaherty | | |
| 9,474,363 B1 * | 10/2016 | Orsini | A47B 3/06 | |
| 9,499,933 B2 * | 11/2016 | Deryckere | F16M 11/00 | |
| 9,602,760 B2 | 3/2017 | Griffin et al. | | |
| 9,660,466 B2 | 5/2017 | Ergun et al. | | |
| 9,668,572 B2 | 6/2017 | Ergun et al. | | |
| 9,783,333 B1 * | 10/2017 | De Los Santos | B65D 5/006 | |
| 9,833,085 B2 * | 12/2017 | Adair | A47B 47/0075 | |
| 9,839,304 B2 * | 12/2017 | Liao | A47F 5/0018 | |
| 9,874,237 B1 * | 1/2018 | Osler | A47C 4/021 | |
| 10,104,957 B2 | 10/2018 | Ergun et al. | | |
| 10,114,352 B2 | 10/2018 | Matlin | | |
| 10,737,834 B2 * | 8/2020 | Veldhuis | B65D 19/0081 | |
| 10,993,528 B1 * | 5/2021 | Mackall, II | B25H 1/04 | |
| 2001/0037987 A1 * | 11/2001 | Culp | A47B 47/042 | 211/186 |
| 2003/0107254 A1 * | 6/2003 | Willy | A47B 3/06 | 297/440.13 |
| 2003/0107255 A1 * | 6/2003 | Willy | A47B 3/06 | 297/440.13 |
| 2003/0221538 A1 * | 12/2003 | Stevens | G10G 5/00 | 84/327 |
| 2004/0228077 A1 | 11/2004 | Hall et al. | | |
| 2006/0209815 A1 * | 9/2006 | Castro-Estevez | A47B 47/0075 | 370/379 |
| 2006/0243784 A1 * | 11/2006 | Glaser | B65D 5/5045 | 229/117.16 |
| 2007/0284974 A1 * | 12/2007 | Buhrman | A47B 47/042 | 312/108 |
| 2008/0134591 A1 * | 6/2008 | Repasky | E04D 11/005 | 52/126.5 |
| 2009/0066140 A1 * | 3/2009 | Berent | A47B 3/06 | 297/440.13 |
| 2009/0308991 A1 | 12/2009 | Stengel | | |
| 2010/0093257 A1 * | 4/2010 | Elliott | A47C 4/03 | 446/478 |
| 2012/0118843 A1 * | 5/2012 | MacLean, III | A47B 47/0075 | 211/144 |
| 2012/0240827 A1 * | 9/2012 | Hidalgo | B65D 19/0095 | 108/50.11 |
| 2012/0242200 A1 * | 9/2012 | Keragala | F16B 12/14 | 312/111 |
| 2013/0081326 A1 * | 4/2013 | Peterson | A01G 9/02 | 47/65.7 |
| 2013/0186309 A1 * | 7/2013 | Niu | B65D 19/0012 | 108/51.3 |

(56) References Cited

U.S. PATENT DOCUMENTS

| | | | |
|---|---|---|---|
| 2014/0131241 A1* | 5/2014 | Soukup | B65D 57/00 206/454 |
| 2014/0251188 A1* | 9/2014 | Jordan | B65D 19/0081 108/51.3 |
| 2014/0263138 A1* | 9/2014 | Koch | A47F 5/101 211/195 |
| 2015/0076871 A1* | 3/2015 | Werner | A47C 9/10 297/135 |
| 2015/0144749 A1* | 5/2015 | Leyshon | F21V 1/06 248/97 |
| 2015/0265047 A1* | 9/2015 | Menard | A47B 47/042 211/186 |
| 2016/0076238 A1* | 3/2016 | Elliott | A63H 33/008 52/742.13 |
| 2016/0192789 A1* | 7/2016 | Liao | A47F 5/10 211/85.4 |
| 2016/0255956 A1* | 9/2016 | Dilmaghani | A47B 87/002 |
| 2017/0055701 A1* | 3/2017 | Latvis, Jr. | A47B 47/0083 |
| 2017/0107013 A1* | 4/2017 | Yoshifusa | B65D 19/0069 |
| 2017/0354273 A1* | 12/2017 | Wilke | A47F 7/0028 |
| 2018/0035799 A1* | 2/2018 | Leafgren | A47B 23/00 |
| 2019/0125070 A1* | 5/2019 | Summerville | A47B 1/03 |
| 2019/0283145 A1* | 9/2019 | Sargent | B23C 1/002 |
| 2020/0317398 A1* | 10/2020 | Gordon | B65D 19/0073 |

* cited by examiner

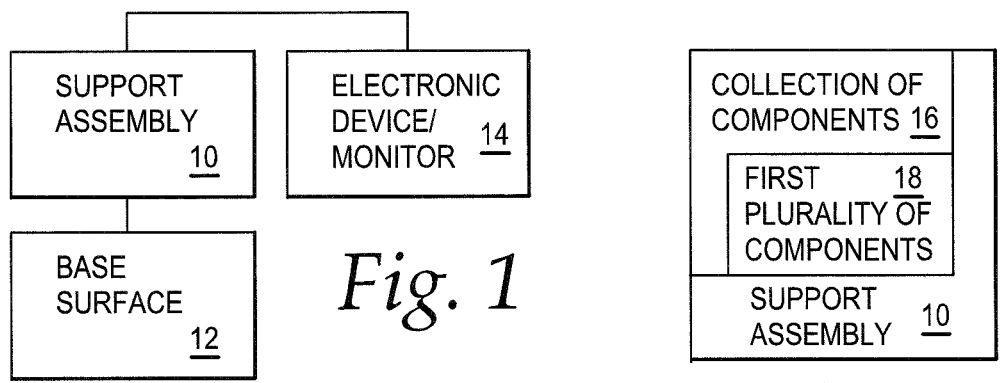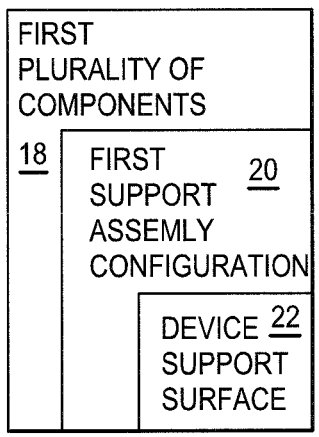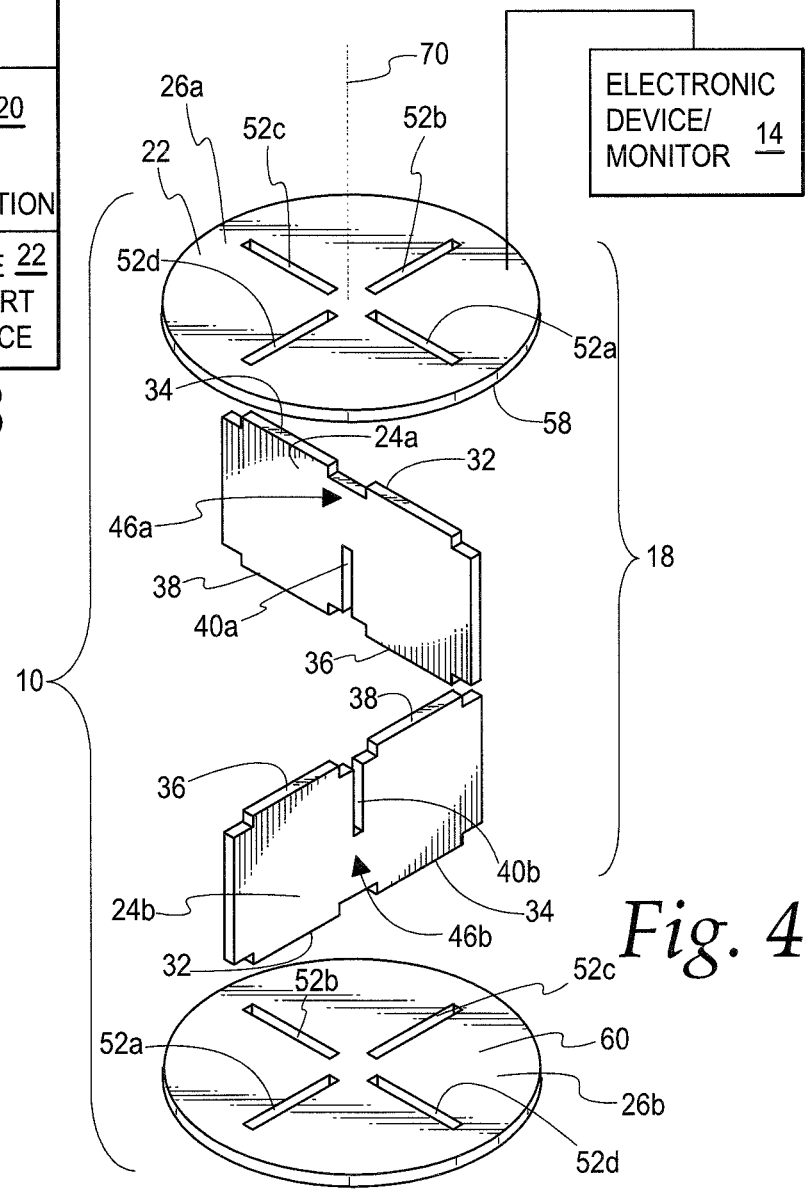

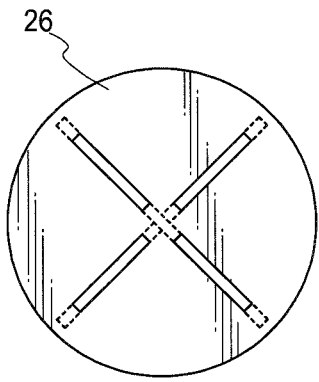
Fig. 10
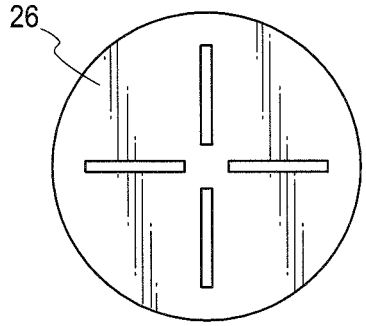
Fig. 5
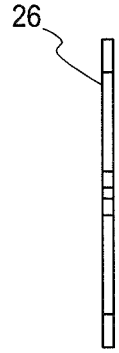
Fig. 6
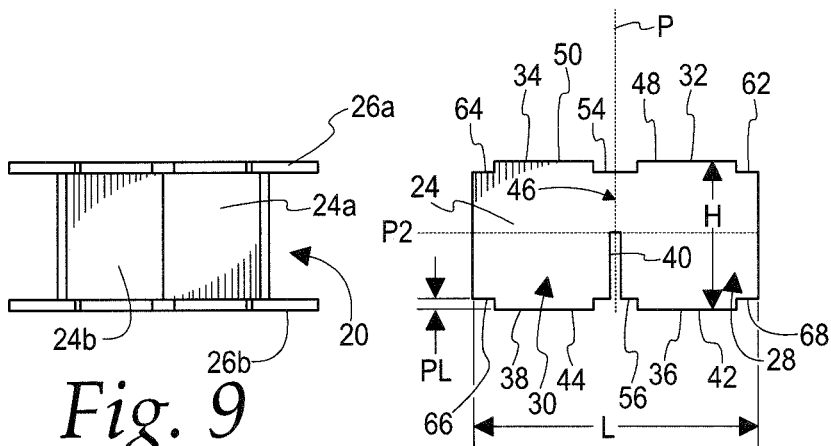
Fig. 9
Fig. 7
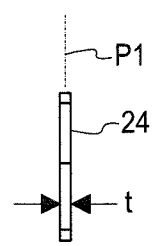
Fig. 8

VARIABLE HEIGHT SUPPORT ASSEMBLY FOR AN ELECTRONIC DEVICE WITH A MONITOR

BACKGROUND OF THE INVENTION

Field of the Invention

This invention relates to electronic devices and, more particularly, to a support for an electronic device to elevate a monitor thereon relative to a base surface to a convenient viewing height.

Background Art

The medical profession has recognized the increasing physical problems that result when individuals tilt their heads downwardly to view monitors on cell phones and computers in both the workplace and in the home environment. The average human head weighs between ten and twelve pounds. When the head is tilted down to view a monitor, pressure on the neck and spine increase substantially leading to injuries that may become chronic. Persistent symptoms may necessitate therapy and/or medical attention which could lead to appreciable down time and loss of productivity.

Doctors recommend that monitors be viewed straight on, with eyes focused at the center of the monitor screen with the head erect, to avoid the above problems. This also reduces muscle and eye strain attributable to viewing with the head tilted.

Many currently existing computer monitors are mounted using adjustable mechanisms, such as those incorporating brackets, reconfigurable linkages, etc., so that the user has the ability to selectively raise and lower the monitor height to get a more desirable viewing perspective, as to address the above potential problems.

Various stands have also been devised for cell phones and self-standing monitors to elevate the monitors to a height above where they would reside in the absence of the supports. Some of these supports are adjustable, while others are fixed in configuration.

Generally, the dedicated supports for electronic devices/monitors are deficient in one or more respects. With a fixed configuration, little flexibility is offered a user as he/she changes posture, chairs, etc. Some of these devices may be cumbersome in nature. At times, particularly with smart phones and the like, it may be desirable to store the support structure compactly when not needed for the sole support function for which they are designed. Large support structures may be unsightly and obtrusive in small work spaces when not in use.

While a multitude of structures currently exists to elevate electronic devices/monitors, the industry continues to seek out alternative designs which are affordable, easy to use, versatile, and readily storable when not in use.

SUMMARY OF THE INVENTION

In one form, the invention is directed to the combination of: an electronic device having a monitor on which viewable data is displayed; and a support assembly made up of a collection of components. The support assembly is configured so that a first plurality of the components can be selectively changed between: a) a first state wherein at least two of the components in the first plurality of components are separated from each other and a third component in the first plurality of components; and b) a second state wherein the first plurality of components cooperatively define a first support assembly configuration. The first support assembly configuration has an operative state with respect to an upwardly facing base surface wherein a device support surface is defined by the first support assembly configuration at a first height in relationship to the upwardly facing base surface relative to which the electronic device is operatively placed. The monitor is higher in relationship to the upwardly facing base surface with the electronic device operatively placed on the device support surface than with the electronic device operatively placed with respect to the upwardly facing base surface with the first support assembly configuration absent. The first plurality of components is changeable between the first and second states without requiring use of any separate fasteners.

In one form, with the first plurality of components in the second state, the third component defines the device support surface.

In one form, the first plurality of components includes a fourth component. The two components reside between the third and fourth components with the first plurality of components in the second state.

In one form, there is a first projection on one of: a) at least one of the two components; and b) the third component that is extended into a first receptacle in the other of the at least one of the two components and the third component with the first plurality of components in the second state. With the electronic device operatively placed on the device support surface with the first support assembly configuration in the operative state, a weight of the electronic device causes the first projection to be urged into the first receptacle.

In one form, the first projection has a length. The first projection and first receptacle are configured to key the at least one component and third component against relative twisting around the length of the first projection.

In one form, the receptacle has an elongate slot configuration.

In one form, the two components each is elongate with a length. The lengths of the two components cross each other on the support assembly configuration as viewed from above.

In one form, the two components are intermeshed with each other on the support assembly configuration.

In one form, the first support assembly configuration has a central axis extending through the third and fourth components. There is a first projection and receptacle pair operating between the third component and one of the two components to confine relative turning between the third component and the one of the two components around the central axis.

In one form, there is a second projection and receptacle pair cooperating between a first of the two components and the fourth component to confine relative turning between the first of the two components and the fourth component around the central axis.

In one form, there are at least two additional projection and receptacle pairs that cooperate between one or both of the two components and one or both of the third and fourth components.

In one form, the collection of components includes two replacement components that are usable in place of the two components to define a second support assembly configuration which has an operative state corresponding to the operative state for the first support assembly configuration. The device support surface on the second support assembly configuration is at a second height in relationship to the upwardly facing base surface that is different than the first height.

In one form, each of the two components and third and fourth components is in the form of a flat sheet with a substantially uniform thickness.

In one form, the uniform thickness is between 0.1 and 0.3 inches.

In one form, the first support assembly configuration has a central axis extending through the third and fourth components. The third, fourth, and two components collectively bound a radially opening storage receptacle.

In one form, the storage receptacle has a "V" shape as viewed along the central axis.

In one form, the first support assembly configuration has a central axis extending through the third and fourth components. The third component has a diameter with respect to the central axis in the range of 8-10 inches.

In one form, the two components have the same construction.

In one form, the third and fourth components have the same construction.

In one form, the third, fourth, and two components collectively bound at least two additional radially opening storage receptacles.

BRIEF DESCRIPTION OF THE DRAWINGS

FIG. 1 is a schematic representation of a support assembly, according to the invention, in an operative state with respect to a base surface for supporting an electronic device/monitor in a raised position with respect to the base surface;

FIG. 2 is a schematic representation of the inventive support assembly and showing additional details thereof;

FIG. 3 is a schematic representation of a plurality of components used to form a first support assembly configuration;

FIG. 4 is a partially schematic, exploded, perspective view of one form of support assembly, according to the invention, with a first configuration;

FIG. 5 is a plan view of one component used on the top and bottom of the support assembly configuration in FIG. 4;

FIG. 6 is a side elevation view of the component in FIG. 5;

FIG. 7 is an elevation view of one of two identical components that are joined to each other and reside between the top and bottom components on the support assembly configuration in FIG. 4;

FIG. 8 is a side elevation view of the component in FIG. 7;

FIG. 9 is an elevation view of the components in FIG. 4 in an assembled state;

FIG. 10 is a plan view of the support assembly configuration in FIG. 9;

DETAILED DESCRIPTION OF THE PREFERRED EMBODIMENT

Figure 11:
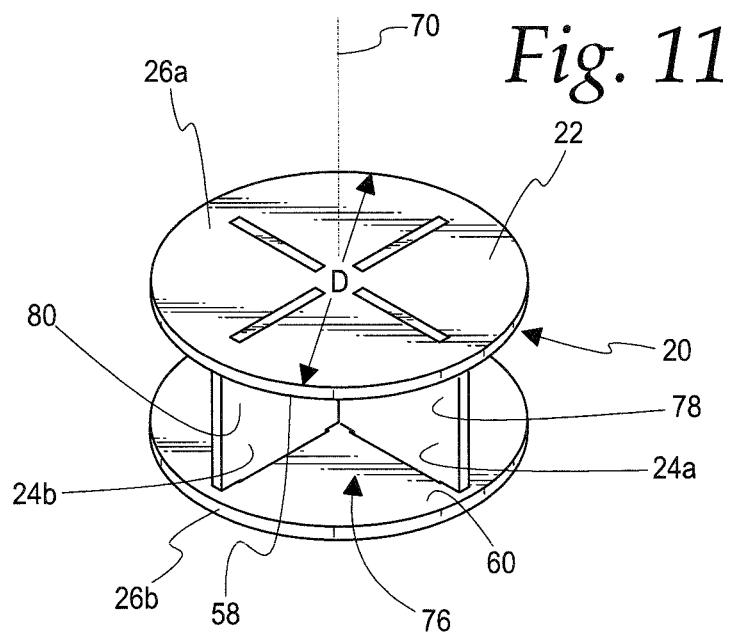
FIG. 11 is a view as in FIG. 4, with the components assembled.

In FIG. 1, there is a schematic representation of one form of the invention, which is made up of a support assembly 10, that is designed to be placed upon a base surface 12, and an electronic device/monitor 14 supported relative to the base surface 12 by the support assembly 10. The electronic device/monitor 14, as shown schematically in FIG. 1, may be any electronic device with a monitor on which viewable data is displayed for viewing by a user. The electronic device/monitor 14 may be, for example, a self-contained monitor or a device, such as a laptop computer or smart phone, that incorporates a monitor as one of its components. The schematic showing in FIG. 1 is intended to encompass virtually every electronic device making up, or having, a viewable monitor.

As shown in further detail in FIG. 2, the support assembly 10 is made up of a collection of components 16. That collection of components 16 includes at least a first plurality of components 18 consisting of at least two components and a third component that can be placed in first and second different states. In the first state, the at least two components are separated from each other and the third component. In the second state, as shown in FIG. 3, the first plurality of components 18 defines a first support assembly configuration 20. With the first support assembly configuration 20 in an operative state with respect to the base surface 12, a device support surface 22 is defined at a first height in relationship to the base surface 12 upon which the electronic device/monitor 14 can be operatively placed.

The electronic device/monitor 14 is higher in relationship to the base surface 12 with the electronic device/monitor 14 placed operatively on the device support surface 22 on the first support assembly configuration 20 in its operative state than with the electronic device/monitor 14 placed operatively with respect to the base surface with the first support assembly configuration 20 absent.

The first plurality of components 18 is changeable between the first and second states without requiring use of any separate fasteners.

The schematic representation of components in FIGS. 1-3 is intended to encompass the specific forms thereof, described hereinbelow, as well as a multitude of variations of those components, and their interaction, which would be obvious to one skilled in the art with the teachings herein in hand. The specific forms hereinbelow are exemplary in nature only and should not be viewed as limiting in nature.

Referring now to FIGS. 4-17, preferred forms of the support assembly 10 will now be described.

As shown in FIGS. 4-11, the first plurality of components 18 consists of at least the aforementioned two components 24a, 24b, and the aforementioned third component 26.

As depicted, the two components 24a, 24b have the same construction and are shown to be identical in configuration and distinguished from each other in the first support assembly configuration by the "a" and "b" designations. The component 24 is in the form of a flat sheet with a substantially uniform thickness t. As depicted, each component 24 has a generally rectangular shape with a height H and a length L. The component 24 has lengthwise halves 28, 30 that are mirror images of each other on opposite sides of a plane P bisecting the length L and orthogonal to a plane P1 within which the component 24 resides.

In the FIG. 7 orientation, the component 24 has elongate upper projections 32, 34 and corresponding lower projections 36, 38. The projection configuration is symmetrical around a plane P2 bisecting the height H and orthogonal to the plane P1.

A slot 40 extends from the line of the free ends 42, 44 of the projections 36, 38 up to the plane P2. With this configuration, the component 24b can be inverted from the FIG. 7 orientation and assembled with the component 24a by directing the region at 46 on each component 24a, 24b into the slot 40 on the cooperating component 24. More specifically, as shown in FIG. 4, the region 46a can be aligned to move into the slot 40b, with the region 46b advanced into the slot 40a. The components 24a, 24b thus intermesh with their lengths crossing. As depicted, the meshed components 24a, 24b define an "X" shape, as viewed from above.

In the fully assembled relationship for the components 24a, 24b, the free ends 42, 44 of the projections 36, 38 are coplanar with the free ends 48, 50 of the projections 32, 34 at both the top and bottom of the intermeshed components 24a, 24b.

The third component 26a is configured to be supported by the combined/intermeshed components 24a, 24b and defines the device support surface 22. The component 26a has radially extending slots/receptacles 52a, 52b, 52c, 52d into which the projections 32, 38, 34, 36, successively extend with the component 26a placed against the meshed components 24, which represents the aforementioned second state for the first plurality of components 18. In the second state, the components 24a, 24b, 26a define the first support assembly configuration 20 shown in FIGS. 9 and 11.

In the depicted embodiment, the first plurality of components 18 additionally includes a fourth component 26b which has an identical configuration to the component 26a and, for description purposes, is distinguished from the upper component 26a by characterizing the upper component in FIG. 4 as 26a and the lower, fourth component in FIG. 4 as 26b.

The meshed arrangement of the components 24a, 24b produces an identical arrangement of the projections 32, 34, 36, 38 at both top and bottom regions whereby the slots 52a-52d on the fourth component 26b cooperate therewith as the slots 52a-52d cooperate with the projections 32, 34, 36, 38 at the top of the components 24.

It is preferred, for reasons of strength and stability, that both the third and fourth components 26a, 26b make up the first plurality of components 18. However, the support assembly 10 is functional with either component 26a, 26b omitted.

With the first plurality of components 18 in the second state and defining the first support assembly configuration 20, and the electronic device/monitor 14 placed against the device support surface 22, the projections 32, 34, 36, 38 are urged by the weight of the electronic device/monitor 14 into the respective slots/receptacles 52a-52d.

In the exemplary embodiment, the components 24, 26 are all made with a thickness t between 0.1 and 0.3 inches. Each of the projections 32, 34, 36, 38 has a projecting length PL approximately equal to the thickness t, whereby at the component 26a, the projections 32, 34, 36, 38 do not extend above, or appreciably above, the device support surface 22. The same relationship is preferably provided with the component 26b at the bottom of the first support assembly configuration 20. A flush arrangement at the top and bottom region is one preferred design.

The edge regions 54, 56 between the projections 32, 34 and 36, 38, respectively, bear upon the underside 58 of the component 26a and the upper side 60 of the component 26b.

Outward edge regions 62, 64 are in line with each other and the edge region 54, with the edge regions 66, 68, aligned with each other and the edge region 56 to provide additional support against the respective surfaces 58, 60 upon which they bear.

The projection and slot/receptacle arrangement depicted produces a positive interconnection between the components 24a, 24b, 26a, 26b and limits, or prevents, relative movement therebetween. However, the invention contemplates that as few as one pair of cooperating projections and slots/receptacles might be utilized to key at least one of the components 24a, 24b from twisting relative to the cooperating component 26a, 26b around its respective projecting length PL in the particular support assembly configuration. The elongate slot construction depicted accomplishes this end, though this elongate arrangement is not required.

In a preferred form, there are multiple pairs of projections and receptacles that cooperate to prevent relative turning of the components 24a, 24b, 26a, 26b about a central, vertical axis 70 on the first support assembly configuration 20 that extends through the components 26a, 26b.

Of course, while in the depicted embodiment the projections are shown on the components 24a, 24b, the invention contemplates a reversal of structure whereby some or all of the projections might be on the components 26a, 26b.

The aforementioned first state for the first plurality of components 18 can be realized by simply disassembling the components 24a, 24b, 26a, 26b after the first support assembly configuration 20 is formed. All components 24a, 24b, 26a, 26b in the depicted embodiment are simply press fit together and can be disassembled by reversing the assembly steps. Thus, transition between the first and second states is readily accomplished without requiring any separate fasteners. That being said, the connection between components might be supplemented by some additional means, such as adhesive, to maintain integrity.

In the second state for the plurality of components 18, the flat components 24a, 24b, 26a, 26b can be placed in a stacked relationship that produces a compact, unobtrusive mass that can be conveniently handled and stored.

The first support assembly configuration 20 can be placed in an operative state by resting the component 26b against the base surface 12 so that the device support surface 22 faces upwardly. If the base surface 12 is flat, the device support surface 22 will be generally parallel thereto and elevated by the combined height of the joined components 24a, 24b, 26a, 26b, which is generally approximately the height dimension H shown in FIG. 7. This height H is selected so that with the electronic device operatively placed on the device support surface 22, the associated monitor is at a desired height in relation to the user's viewing perspective.

Figure 14:
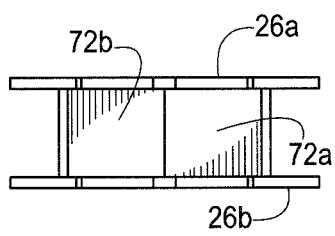
FIG. 14 is a view as in FIG. 9 using the components as shown in FIGS. 12 and 13 to substitute for those shown in FIGS. 7 and 8.
Figure 12:
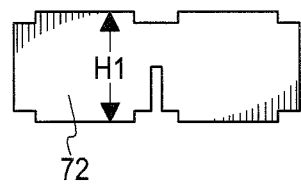
FIG. 12 is a view as in FIG. 7 showing an alternative form of that component with a different dimension and that can be substituted for the component in FIG. 7 to define a modified support assembly configuration.
Figure 13:
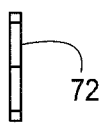
FIG. 13 is a side elevation view of the component in FIG. 12.

In one preferred form, the collection of components 16 includes two replacement components 72, as shown in FIGS. 12-14. The replacement components 72 are usable in pairs and have the same construction as the components 24, with the exception that the height dimension H1 is different than the height dimension H for the components 24. For example, the height dimension H may be on the order of four inches with the height dimension H1 on the order of three inches. The components 72a, 72b cooperate with each other and the components 26a, 26b in the same manner that the components 24a, 24b cooperate with each other and the components 26a, 26b.

Accordingly, with all of the components 26a, 26b, 24a, 24b, 72a, 72b available, a user can select a desired height for the support assembly configuration and use the appropriate collection of components, specifically selecting the components 24, 72, one in place of the other.

The user has the ability to disassemble the components from a previously constructed support assembly configuration to place the plurality of components in the aforementioned first state wherein they are all separated from each other.

Figure 17:
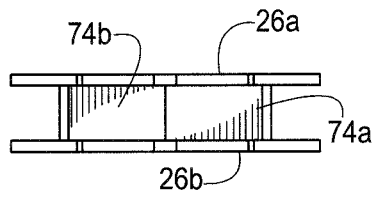
FIG. 17 is a view as in FIGS. 9 and 14 wherein a third support assembly configuration is defined using the components in FIGS. 15 and 16.
Figure 15:
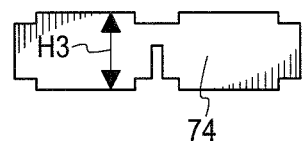
FIG. 15 is a view as in FIGS. 7 and 12 showing a further alternative form of the component.
Figure 16:
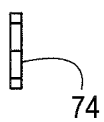
FIG. 16 is a side elevation view of the component in FIG. 15.

The collection of components 16 may include additional components, such as the representative component 74, as shown in FIGS. 15-17, with two of the components 74a, 74b operatively connectable with the components 26a, 26b to produce a third support assembly configuration, as shown in FIG. 17. The height H3 is different than the heights H, H1. For example, the height H3 may be two inches. The height range of 2-4 inches is exemplary in nature only, as the height range could be considerably above 2-4 inches.

While the component 26 is shown usable at the top and bottom of each selected support assembly configuration, as noted above, the lower component 26b might be eliminated or substituted for by a component having a different shape than the component 26s. In the depicted form, the component 26 has a round, disk shape. Any other shape that defines a device support surface adequate to support the particular electronic device/monitor 14 is contemplated. As just examples, the shape might be square, rectangular, etc.

The first support assembly configuration 20 is shown with the central axes of the disk-shaped components 26a, 26b aligned. An exemplary range of suitable diameters D is in the range of 8-10 inches. However, this should not be viewed as limiting, as the shape and dimensions would be dictated by the particular electronic device/monitor 14 to be supported.

Another advantage of the aforementioned construction utilizing the paired components 24, 72, 74 is that at least one storage compartment/receptacle 76, as shown in the representative configuration in FIG. 11, is bounded by the underside 58 of the component 26a and the upper side 60 of the component 26b and surfaces 78, 80 on the components 24a, 24b where they project outwardly from the central axis 70. The crossing arrangement of the components 24a, 24b produces four such V-shaped receptacles that open radially outwardly with respect to the axis 70, as viewed therealong.

The storage compartments 76 provide receptacles at which supplies typically employed in offices around a computer might be temporarily placed and/or accumulated. For example, paper clips, tape, knickknacks, etc. might be placed in a storage component 76 whereby they might be neatly stored and readily accessible when desired.

The material making up the components is not limited. As an example, the components may be laser cut from a sheet product or made from acrylic, sign-grade acrylic, PETG, or ABS. Polycarbonate could be used. However, since laser cutting of polycarbonate may produce hazardous fumes, formation of the components using mechanical means would be more practical.

The foregoing disclosure of specific embodiments is intended to be illustrative of the broad concepts comprehended by the invention.

The invention claimed is:

1. A kit usable to selectively define a variable height support for a device with a monitor, the kit comprising:

a support assembly comprising: a collection of components comprising two support components, two replacement support components, a third component, and a fourth component, the collection of components configured so that a first plurality of the components, comprising the two support components, the third component, and the fourth component, can be selectively changed between: a) a first state wherein the two support components are separated from each other and the third component and fourth component and b) a second state wherein the first plurality of components cooperatively define a first support assembly configuration, the first support assembly configuration having a first operative state with respect to an upwardly facing base surface wherein a device support surface is defined by the third component in the first support assembly configuration at a first height in relationship to the upwardly facing base surface relative to which a device with a monitor can be operatively placed, wherein the first plurality of components is changeable between the first and second states without requiring use of any separate fasteners, wherein the two replacement support components are differently dimensioned than the two support components and are usable in place of the two support components to cooperate with the third component and fourth component to define a second support assembly configuration which has a second operative state corresponding to the first operative state for the first support assembly configuration, wherein the device support surface defined by the third component in the second support assembly configuration is at a second height in relationship to the upwardly facing base surface that is different than the first height, wherein there is a first projection formed integrally on each of the two support components that is extended into a respective first receptacle extending through the third component by relative movement of the two support components and the third component vertically relative to each other from an initially separated relationship to achieve the second state, and when in the first support assembly configuration, the first projections are configured to be urged vertically into the respective first receptacles by a weight of a device operatively placed on the device support surface, wherein the support assembly is configured such that when the two support components and the third component are moved vertically relative to each other from the initially separated relationship to achieve the second state, vertically oppositely facing surfaces on the two support components and the third component abut to maintain a vertical relationship between the two support components and the third component and the first projections do not project substantially above the device support surface defined by the third component, wherein when the first support assembly configuration is in the first operative state, the two support components and the third component can be relatively vertically moved to withdraw the first projections from the first receptacles and separate the third component from the two support components, wherein there is an additional projection formed on each of the two replacement support components that cooperates with the respective first receptacles that are on the third component, and when in the second support assembly configuration, the additional projections on the two replacement support components are configured to be urged vertically into the respective first receptacles by a weight of a device operatively placed on the device support surface, wherein the first support assembly configuration has a central axis extending through the third component, wherein the first projections and first receptacles each make up a first projection and receptacle pair cooperating between the third component and each of the two support components and there is a second projection and receptacle pair cooperating between the third component and each of the two support components and the central axis resides between and is spaced from the first and second projection and receptacle pairs, wherein the two support components reside between the third and fourth components when the first plurality of components are in the second state, wherein the two support components are intermeshed with each other in the first support assembly configuration.

2. The kit according to claim 1, wherein the first projection has a length and the first projection and first receptacle are configured to key the two support components and third component against relative twisting around the length of the first projection.

3. The kit according to claim 2, wherein the first receptacles have an elongate slot configuration and are bounded by a surface that extends fully around the first projections.

4. The kit according to claim 1, wherein each of the two support components is elongate with a length and the lengths of the two support components cross each other in the first support assembly configuration when viewed from above.

5. The kit according to claim 1 wherein the central axis extends through the fourth component.

6. The kit according to claim 5, wherein there is a third projection and receptacle pair cooperating between each of the two support components and the fourth component to confine relative turning between the two support components and the fourth component around the central axis.

7. The kit according to claim 1, wherein each of the two support components and third and fourth components is in the form of a flat sheet with a substantially uniform thickness.

8. The kit according to claim 7 wherein the uniform thickness is between 0.1 and 0.3 inches.

9. The kit according to claim 7 wherein the third, fourth, and two support components collectively bound a radially opening storage receptacle.

10. The kit according to claim 9 wherein the storage receptacle has a "V" shape as viewed along the central axis.

11. The kit according to claim 9, wherein the third, fourth, and two support components collectively bound at least two additional radially opening storage receptacles.

12. The kit according to claim 1 wherein the third component has a diameter with respect to the central axis in a range of 8-10 inches.

13. The kit according to claim 1 wherein the two support components have a same construction.

14. The kit according to claim 1 wherein the third and fourth components have a same construction.

15. The kit according to claim 1 wherein none of the receptacles extends to the central axis on the third component.

16. The kit according to claim 1 in combination with a device with a monitor on which viewable data is displayed and that can be operatively placed on the device support surface defined by the third component in each of the first and second support assembly configurations with the first and second support assembly configurations in respective operative states.

* * * * *